(12) United States Patent
Tseng et al.

(10) Patent No.: US 12,341,072 B2
(45) Date of Patent: Jun. 24, 2025

(54) MANUFACTURING METHOD OF SEMICONDUCTOR PACKAGE

(71) Applicant: Taiwan Semiconductor Manufacturing Company, Ltd., Hsinchu (TW)

(72) Inventors: Shih-Hao Tseng, Hsinchu (TW); Hung-Jui Kuo, Hsinchu (TW); Ming-Che Ho, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 209 days.

(21) Appl. No.: 17/978,971

(22) Filed: Nov. 2, 2022

(65) Prior Publication Data

US 2023/0052776 A1    Feb. 16, 2023

Related U.S. Application Data

(62) Division of application No. 16/835,146, filed on Mar. 30, 2020, now Pat. No. 11,495,506.

(51) Int. Cl.
*H01L 23/00* (2006.01)
*H01L 21/56* (2006.01)
(Continued)

(52) U.S. Cl.
CPC .......... *H01L 23/3114* (2013.01); *H01L 21/56* (2013.01); *H01L 23/49827* (2013.01);
(Continued)

(58) Field of Classification Search
CPC ................ H01L 23/3114; H01L 21/56; H01L 23/49827; H01L 24/17; H01L 24/32; H01L 2224/0237; H01L 2224/12105; H01L 2224/28105; H01L 25/50; H01L 25/105; H01L 24/20; H01L 24/97; H01L 21/561; H01L 24/19; H01L 2224/32145; H01L 2224/73265; H01L 2224/48091; H01L 2224/92244; H01L 2225/1041; H01L 2225/06568; H01L 2225/1058; H01L 2224/04105; H01L 2224/48227;
(Continued)

(56) References Cited

U.S. PATENT DOCUMENTS 8,993,380 B2    3/2015    Hou et al.
9,281,254 B2    3/2016    Yu et al.
(Continued)

*Primary Examiner* — Antonio B Crite
(74) *Attorney, Agent, or Firm* — JCIPRNET

(57) ABSTRACT

A manufacturing method of a semiconductor package includes the following steps. An integrated circuit structure is provided, wherein the integrated circuit structure includes an integrated circuit and a metallization layer covering a back surface of the integrated circuit. An encapsulation material is provided to laterally encapsulate the integrated circuit structure. A redistribution structure is provided over the integrated circuit structure and the encapsulation material, wherein the redistribution structure includes a thermal metal layer furthermost from the integrated circuit structure, wherein the thermal metal layer is thermally coupled to the metallization layer. A solder layer is provided over the thermal metal layer, wherein the solder layer is thermally coupled to the thermal metal layer.

20 Claims, 14 Drawing Sheets

(51) Int. Cl.
*H01L 21/683* (2006.01)
*H01L 23/31* (2006.01)
*H01L 23/36* (2006.01)
*H01L 23/498* (2006.01)
*H01L 25/00* (2006.01)
*H01L 25/065* (2023.01)

(52) U.S. Cl.
CPC .............. *H01L 24/17* (2013.01); *H01L 24/32* (2013.01); *H01L 2224/0237* (2013.01); *H01L 2224/12105* (2013.01); *H01L 2224/28105* (2013.01)

(58) Field of Classification Search
CPC . H01L 2224/32225; H01L 2924/15311; H01L 21/568; H01L 2225/0651; H01L 2224/73267; H01L 2225/1035; H01L 2924/00014; H01L 2924/00; H01L 23/36; H01L 25/0652
See application file for complete search history.

(56) References Cited

U.S. PATENT DOCUMENTS

| | | | |
|---|---|---|---|
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2010/0193949 A1* | 8/2010 | Belanger | H01L 24/05 257/E23.021 |
| 2015/0303174 A1* | 10/2015 | Yu | H01L 24/19 438/109 |
| 2016/0049723 A1* | 2/2016 | Baks | H01Q 9/0457 343/848 |
| 2016/0315051 A1* | 10/2016 | Lin | H01L 23/5386 |

* cited by examiner

MANUFACTURING METHOD OF SEMICONDUCTOR PACKAGE

CROSS-REFERENCE TO RELATED APPLICATION

This application is a divisional application of and claims the priority benefit of a prior application Ser. No. 16/835,146, filed on Mar. 30, 2020. The entirety of the above-mentioned patent application is hereby incorporated by reference herein and made a part of this specification.

BACKGROUND 3D package applications such as package on package (PoP) are becoming increasingly popular and widely used in mobile devices. This is because they can enhance electrical performance by integrating logic chips (e.g., application processors (APs)), high capacity/bandwidth memory chips (e.g., wide input/out 2 (WIO2) chips, low power double data rate X (LPDDRx) chips, and the like), and/or other heterogeneous chips (e.g., sensors, micro-electro-mechanicals (MEMs), networking devices, and the like), for instance.

It is realized, however, that the 3D package structure may generate a significant amount of heat while such a system is in operation. As a result, the issue of heat dissipation in a 3D package structure should be raised and addressed, and solutions be sought in order to maintain the reliability and the desired performance of a stacked chip structure where high power consumption leads to a high operating temperature.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
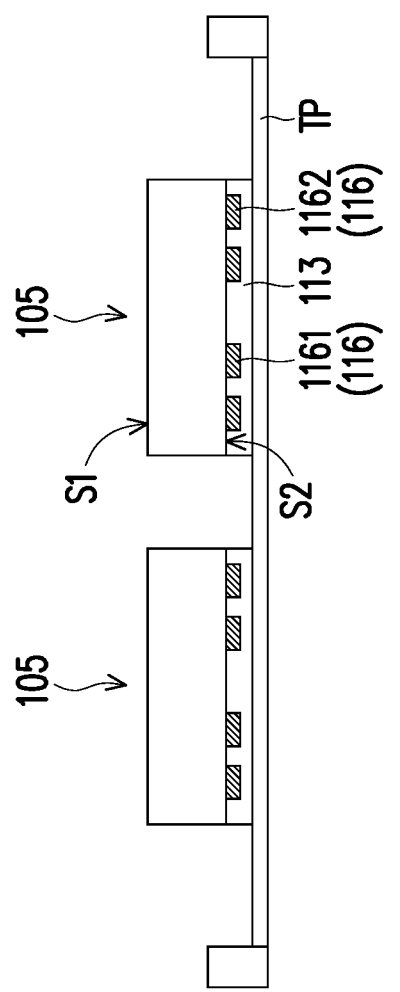
FIG. 1 to FIG. 14 illustrate cross sectional views of intermediate stages in a manufacturing of a semiconductor package according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

FIG. 1 to FIG. 14 illustrate cross sectional views of intermediate stages in a manufacturing of a semiconductor package according to some exemplary embodiments of the present disclosure. In some aspects, various example embodiments may enable a thin package profile integrating memory (e.g., LPDDRx, WIO2, etc.) and logic chips, for example. Improved memory capacity and bandwidth may be achieved in thin-profiled stacked fan-out packages. Embodiments may use through silicon vias (TSVs) as an option for electrical connection, thus reducing manufacturing cost. Embodiments may include a logic-first and/or logic-last configuration with integrated fan-out package structures. Each fan-out tier of the device package may include one or more of low power-double data rate X (LPDDRx), wide input/output (WIO) memory, WIO2 memory, NAND flash, SRAM catch, and the like memory chips. Other types of chips, such as, logic, analog, sensor, networking, micro-electro-mechanical (MEMS), and the like, may also be included. The number of chips in each fan-out tier may be greater than or equal to one. The integrated fan-out package may be used for various applications, such as, mobile computing, mobile health (e.g., heath monitoring), wearable electronics, internet of things (IoT), big data, and the like.

In some exemplary embodiments, a manufacturing method of a semiconductor package may include the following steps. Referring to FIG. 1, in some embodiments, at least one first integrated circuit 105 (illustrated as two first integrated circuits 105, but not limited thereto) is provided on a tape carrier TP. In some embodiments, the first integrated circuit 105 may be attached to the tape carrier TP with using an adhesive to prepare the first integrated circuit 105 for a subsequent process. In some embodiments, the tape carrier TP may be a film tape or any suitable carrier to provide mechanical support for subsequent operations. The adhesive may be a die attach film or any suitable adhesive, epoxy, ultraviolet (UV) glue (which loses its adhesive property when exposed to UV radiation), or the like, and may be formed using a deposition process, a spin coating, a printing process, a lamination process, or the like. In some embodiments, the adhesive may have a multilayer structure and may include a release layer (not show). The release layer may help to safely remove individual dies from the tape carrier TP after the process is completed. In some embodiments, the release layer may be a UV type, wherein adhesive strength of the release layer is substantially reduced after exposing the release layer to UV radiation. In other embodiments, the release layer may be a thermal type, wherein adhesive strength of the release layer is substantially reduced after exposing the release layer to a suitable heat source. The disclosure is not limited thereto.

In some embodiments, the first integrated circuit 105 may include a first active surface S2, a first back surface S1 opposite to the first active surface S2, a plurality of conductive pads 116 disposed on the first active surface S2 of the first integrated circuit 105 and an insulation layer 113 covering the conductive pads 116. In some alternative embodiments, the insulation layer 113 may expose the conductive pads 116. In some embodiments, the conductive pads 116 may include a plurality of functional pads 1161 and a plurality of thermal (dummy) pads 1162. For example, the functional pads 1161 in a semiconductor package are electrically connected to a front-side and/or back-side redistribution structure or an electrical component of the same semiconductor package or another semiconductor package. However, the thermal (dummy) pads 1162 may be at a floating potential and electrically insulated from a front-side or back-side redistribution layer structure or an electrical component of the same semiconductor package or another semiconductor package. In some embodiments, the thermal (dummy) pads 1162 are electrically insulated from the functional vias 1161 and may be used, for example, to adjust a local pattern density for better polishing effect.

In accordance with some embodiments of the disclosure, the first integrated circuit 105 may be a memory die such as LPDDRx, WIO, WIO2, NAND flash, and the like. In other embodiments, the first integrated circuit 105 may be any type of integrated circuit, such as analog circuit, digital circuit, sensor die, micro-electro-mechanical (MEMS) die, networking die, and the like. In some embodiments, the first integrated circuit 105 may be a dynamic random access memory (DRAM), although other memory types including, but not limited to, static random access memory (SRAM) and read only memory may be used.

In some exemplary embodiment, the first integrated circuit 105 is disposed on the tape carrier TP with the active surface S2 facing the tape carrier TP (i.e. facing down). In other words, the first integrated circuit 105 is disposed on the tape carrier TP with the first back surface S1 faces away from the tape carrier TP. In some embodiments, more than one of the first integrated circuits 105 may be disposed on the tape carrier TP. The disclosure does not limit the number of the first integrated circuit 105.

Figure 2:
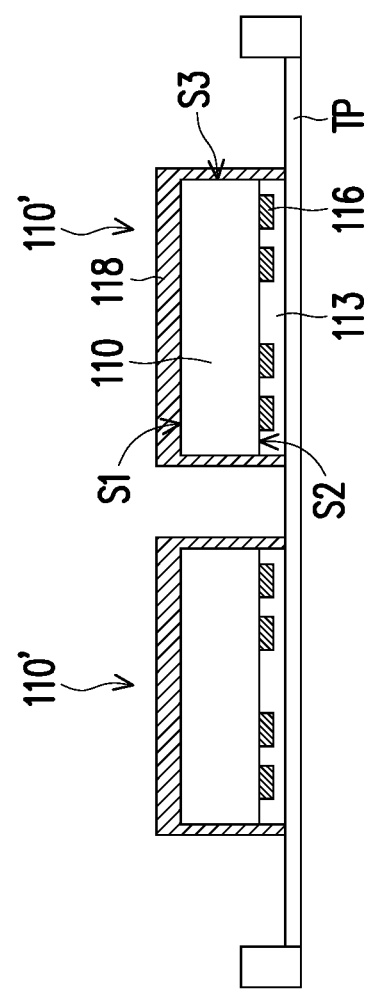

Referring to FIG. 2, in some embodiments, the first metallization layer 118 is formed on the first integrated circuit 105, so that the first integrated circuit structure 110' is formed. In certain embodiments, the first metallization layer 118 at least covers the first back surface S1 of the first integrated circuit 105. In the present embodiments, the first metallization layer 118 covers the first back surface S1, a first side surface S3 and a side surface of the insulation layer 113. In other words, the first metallization layer 118 covers the back of the first integrated circuit 105 in conformal manner. In some embodiments, the first metallization layer 118 may be made of an electrically conductive material.

Materials used for the first metallization layer 118 may include copper, nickel, an alloy of nickel and iron, an alloy of copper and nickel, silver, etc., but not limited thereto. In some embodiments, the first metallization layer 118 may be fabricated by using sputtering, electrolytic plating, electroless plating, physical vapor deposition ("PVD"), chemical vapor deposition ("CVD"), or other suitable metal deposition process. Throughout the description, the resultant structure including the first integrated circuit 105 and the first metallization layer 118 covering the first back surface S1 as shown in FIG. 2 is referred to as the first integrated circuit structure 110'.

In the present embodiment, the first integrated circuit 105 is an integrated circuit with on side I/O, which means the conductive pads 116 are disposed on one side (e.g. the active surface S2) of the integrated circuit 105. In some alternative embodiments, the first integrated circuit 105 may be an integrated circuit with double side I/O, which means the conductive pads 116 may be disposed on two opposite sides (e.g. the active surface S2 and the back surface S1) of the integrated circuit 105. In such embodiment, the first metallization layer 118 may have openings for exposing the functional pads 1161 on the back surface S1. In some embodiments, the pattern of the first metallization layer 118 with the openings may be formed by a hard mask, photolithography, or the like. The disclosure is not limited thereto.

Figure 3:
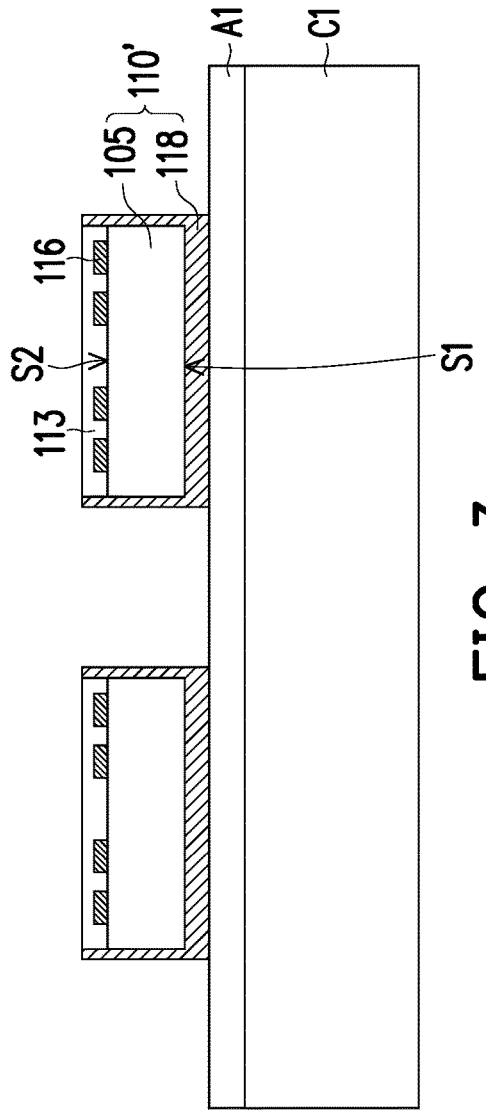

Referring to FIG. 2 and FIG. 3, a pick and place process may be performed by a pick and place tool to pick up the first integrated circuit structures 110' from the tape carrier and place the first integrated circuit structures 110' on a carrier C1. In some embodiments, the pick and place tool is configured to pick up the first integrated circuit structures 110' one-by-one from the tape carrier TP, and flip the first integrated circuit structures 110', so that the first active surface S2 of the first integrated circuit 105 may face up for the subsequent process. In other words, the first integrated circuit structures 110' is placed on the carrier C1 with the first back surface S1 of the first integrated circuit 105 facing the carrier C1.

In some embodiments, the first integrated circuit structure 110' is attached onto the carrier C1 by an adhesive A1, which may be a die attach film (DAF), or the like. In some embodiments, the carrier C1 may be a glass carrier, a ceramic carrier, or the like, and may provide temporary structural support during the formation of various components of a semiconductor package (e.g., the semiconductor package 100 shown in FIG. 11). In some embodiments, the carrier C1 may be coated with a de-bonding layer. The material of the debond layer may be any material suitable for de-bonding the carrier C1 from the above layers disposed thereon. For example, the de-bonding layer may be a ultra-violet (UV) curable adhesive, a heat curable adhesive, an optical clear adhesive or a light-to-heat conversion (LTHC) adhesive, or the like, although other types of de-bonding layer may be used. In addition, the de-bonding layer may be also adapted to allow light or signal to pass through. It is noted that the materials of the de-bonding layer and the carrier C1 are merely for illustration, and the disclosure is not limited thereto.

Figure 4:
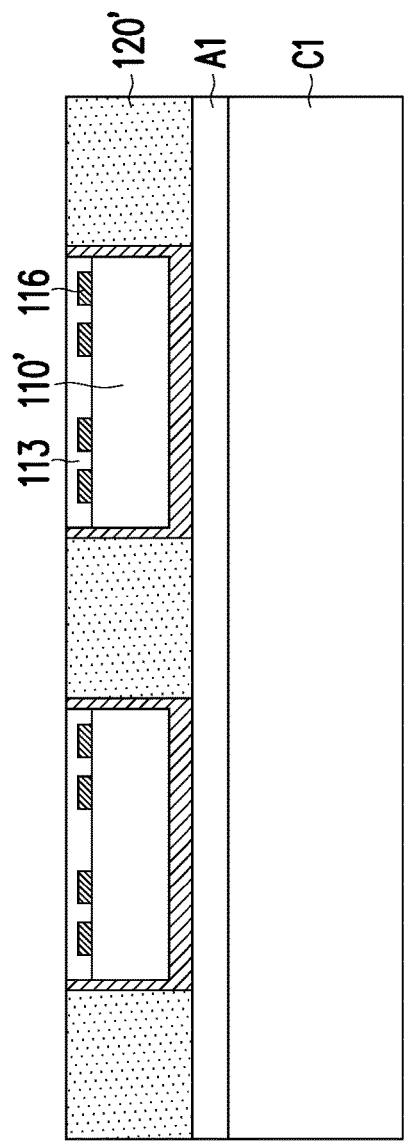
Figure 5:
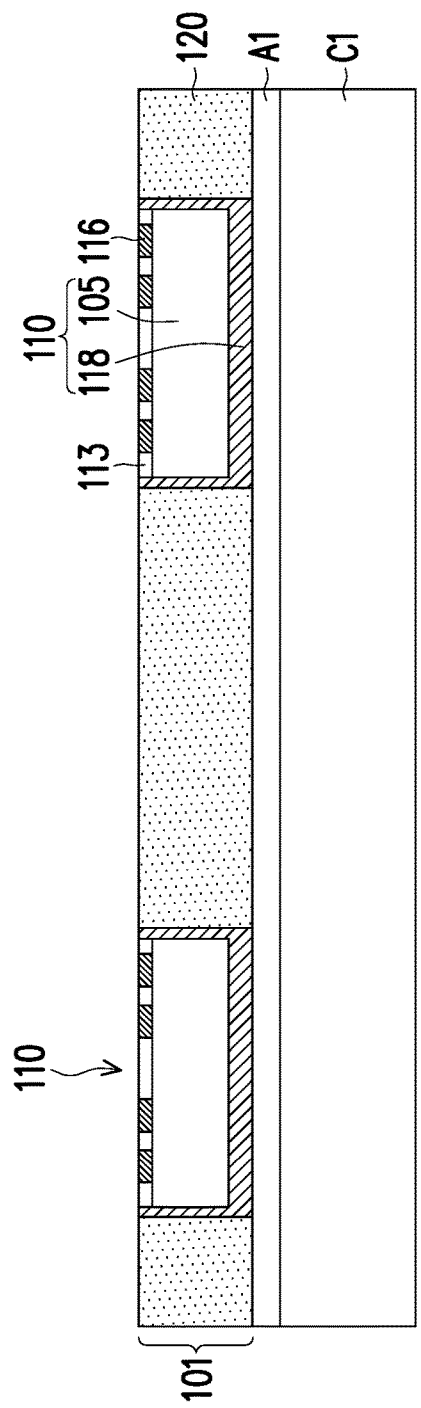

Referring to FIG. 4 and FIG. 5, a first encapsulating material 120' is provided on the carrier C1 to laterally encapsulate the first integrated circuit structure 110'. In some embodiments, the first encapsulating material 120' may include a molding compound, an epoxy, a resin, or the like. In one of the implementations, the molding compound includes various materials, for example, one or more of epoxy resins, phenolic hardeners, silicas, catalysts, pigments, mold release agents, etc. In some embodiments, a top surface of the first encapsulating material 120' may be higher than the top surfaces of the conductive pads 116. Namely, the first encapsulating material 120' covers the top surfaces of the conductive pads 116. Then, a thinning process, which may be a grinding process, is performed to thin the first encapsulating material 120' until the top surfaces of the conductive pads 116 are revealed. The resulting structure is shown in FIG. 5. Due to the thinning process, the top surfaces of the conductive pads 116 are substantially level with the top surface of the first encapsulating material 120 and the top surface of the insulation layer 113.

Throughout the description, the resultant structure including the first integrated circuit structure 110 and the first encapsulating material 120 as shown in FIG. 5 is referred to as the first encapsulated integrated circuit 101, which may have a wafer form in the process. Accordingly, the first encapsulated integrated circuit 101 includes first integrated circuit structure 110 and the first encapsulation material 120 laterally encapsulating the first integrated circuit structure 110, wherein the first integrated circuit structure 110 includes the first integrated circuit 105 having the first back surface S1 and the first metallization layer 118 covering the first back surface S1.

Figure 6:
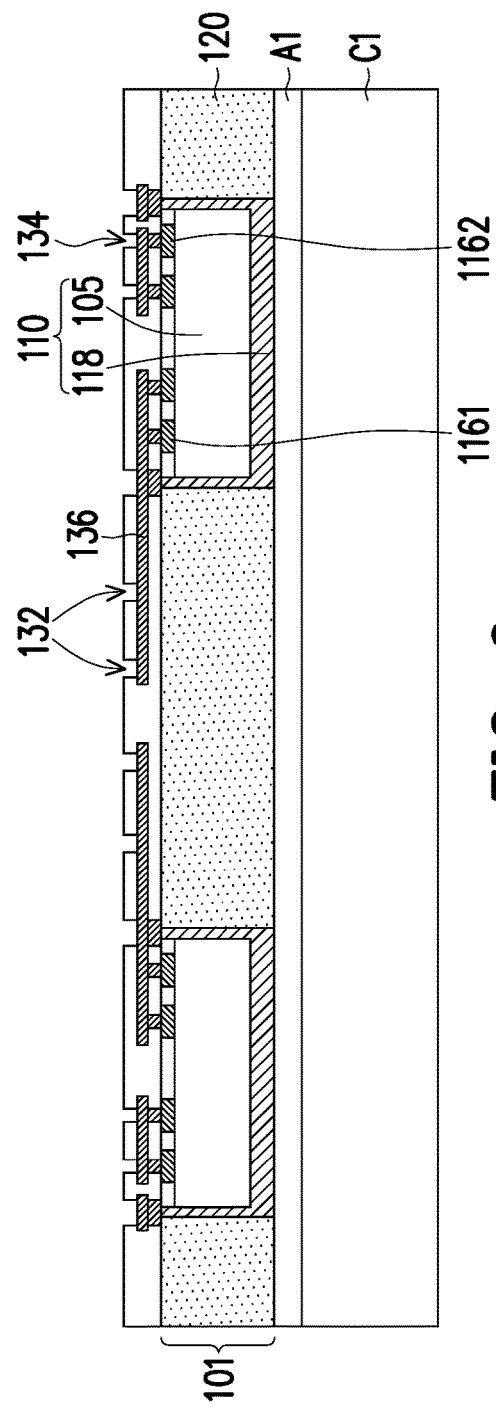
Figure 7:
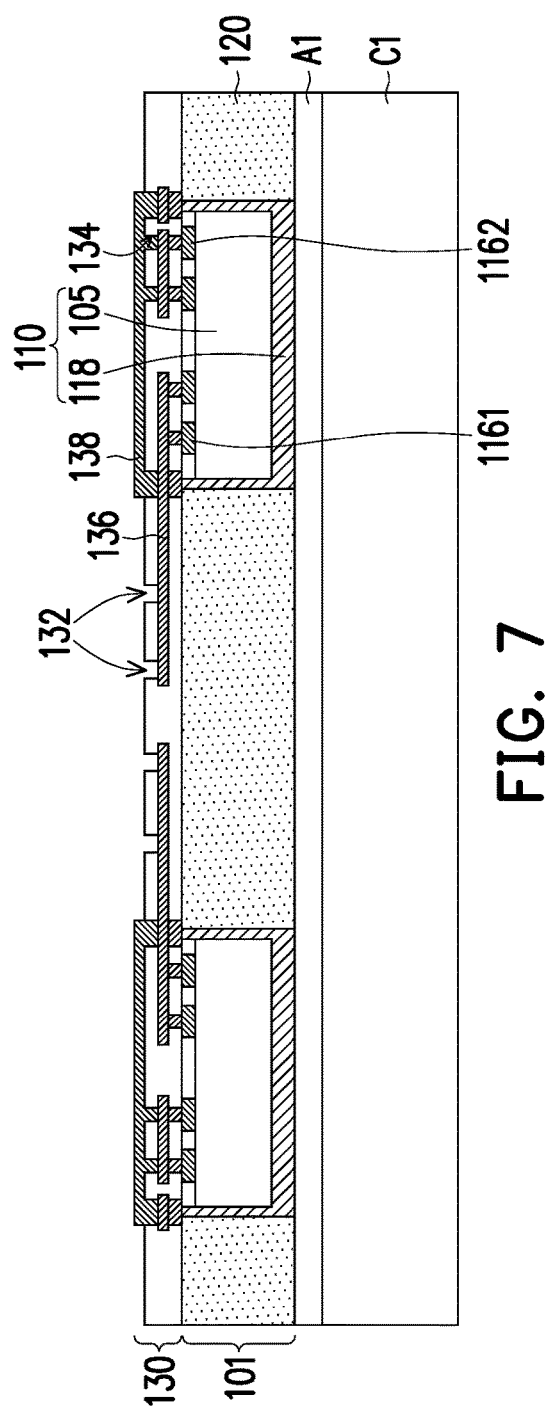

With now reference to FIG. 6 and FIG. 7, in some embodiments, a first redistribution structure 130 is formed over the first encapsulated integrated circuit 101, which includes the first integrated circuit structure 110 and first encapsulation material 120. In some embodiments, the first back surface S1 faces away from the first redistribution structure 130, and the first redistribution structure 130 is electrically connected to the conductive pads 116 of the first integrated circuit 105. In some embodiments, the redistribution structure 130 may be formed by, for example, depositing conductive layers, patterning the conductive layers to form redistribution circuits, partially covering the redistribution circuits and filling the gaps between the redistribution circuits with dielectric layers, etc. The material of the redistribution circuits may include a metal or a metal alloy including aluminum, copper, tungsten, and/or alloys thereof. The dielectric layers may be formed of dielectric materials such as polybenzoxazole (PBO), polyimide (PI), oxides, nitrides, carbides, carbon nitrides, combinations thereof, and/or multi-layers thereof. The redistribution circuits are formed in the dielectric layers and electrically connected to the first integrated circuit 105.

Figure 16:
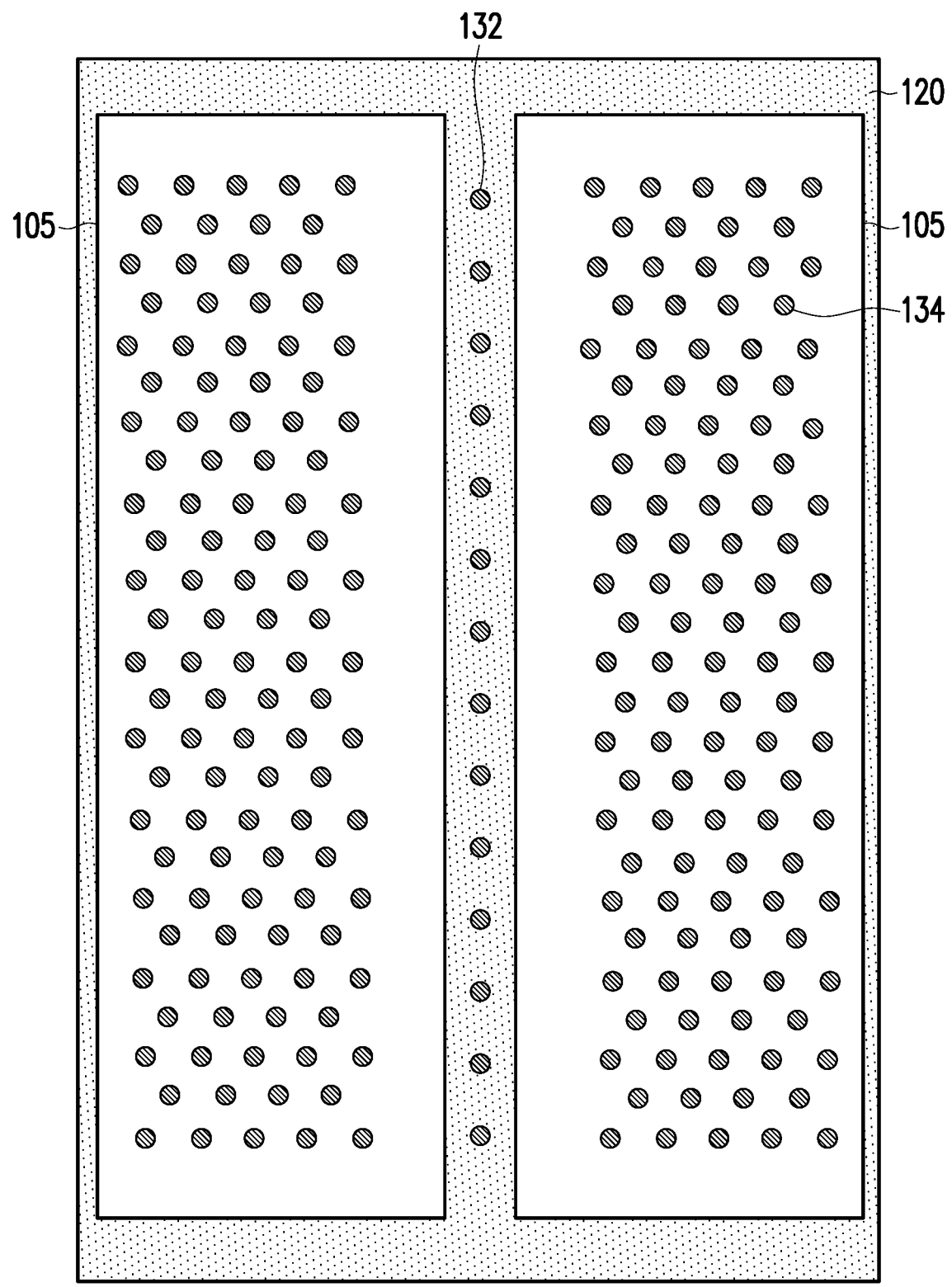
FIG. 16 illustrates a partial top view of an intermediate stage in a manufacturing of a semiconductor package according to some exemplary embodiments of the present disclosure.

FIG. 16 illustrates a partial top view of an intermediate stage in a manufacturing of a semiconductor package according to some exemplary embodiments of the present disclosure. Referring to FIG. 6 and FIG. 16, in some embodiments, the first redistribution structure 130 may include a plurality of functional vias 132 electrically connected to the functional pads 1161 and a plurality of thermal (dummy) vias 134 thermally coupled to the thermal (dummy) pads 1162. The functional vias 132 may be disposed within the dielectric layers for connecting the redistribution circuits. In some embodiments, the functional vias 132 may be disposed outside the region right above the first integrated circuit 105, and are electrically connected to the functional pads 1161 through redistribution circuit 136. The thermal vias 134 may also be disposed within the dielectric layers. In some embodiments, the thermal vias 134 are electrically insulated from any functional circuit, functional vias 132 and/or functional pads 1161. Instead, the thermal vias 134 may be connected to thermal (dummy) circuits of first redistribution structure 130. Accordingly, the thermal (dummy) vias 134 may reinforce the mechanical strength of the dielectric layers.

Figure 8:
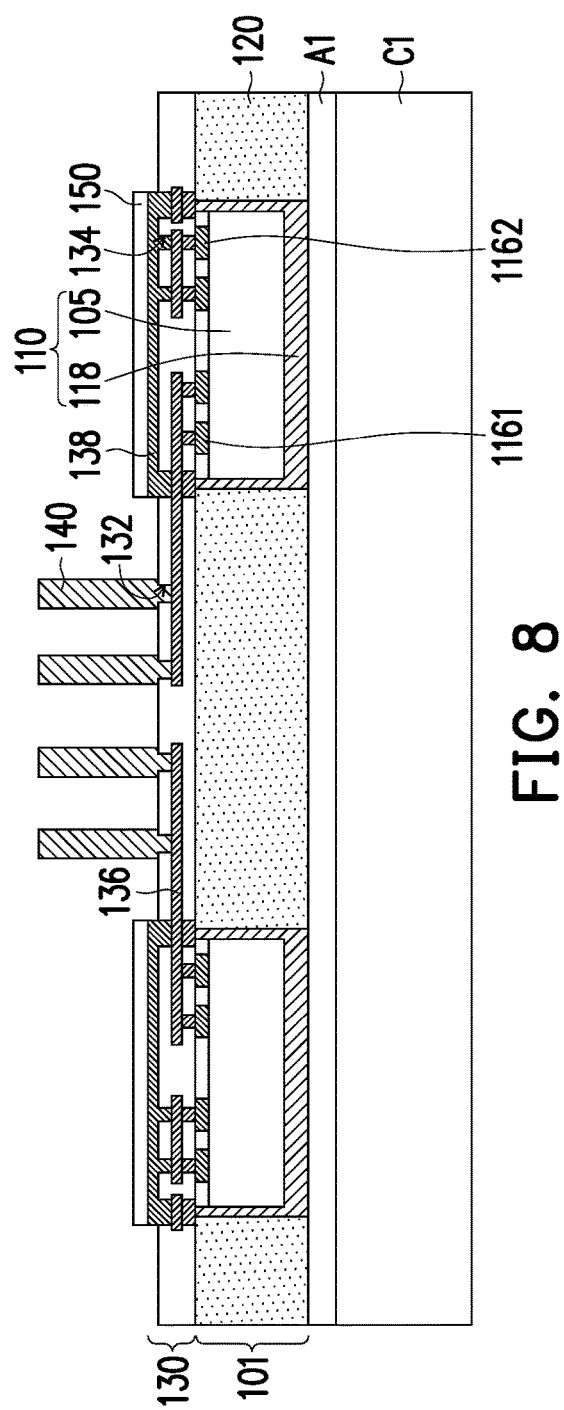
Figure 9:
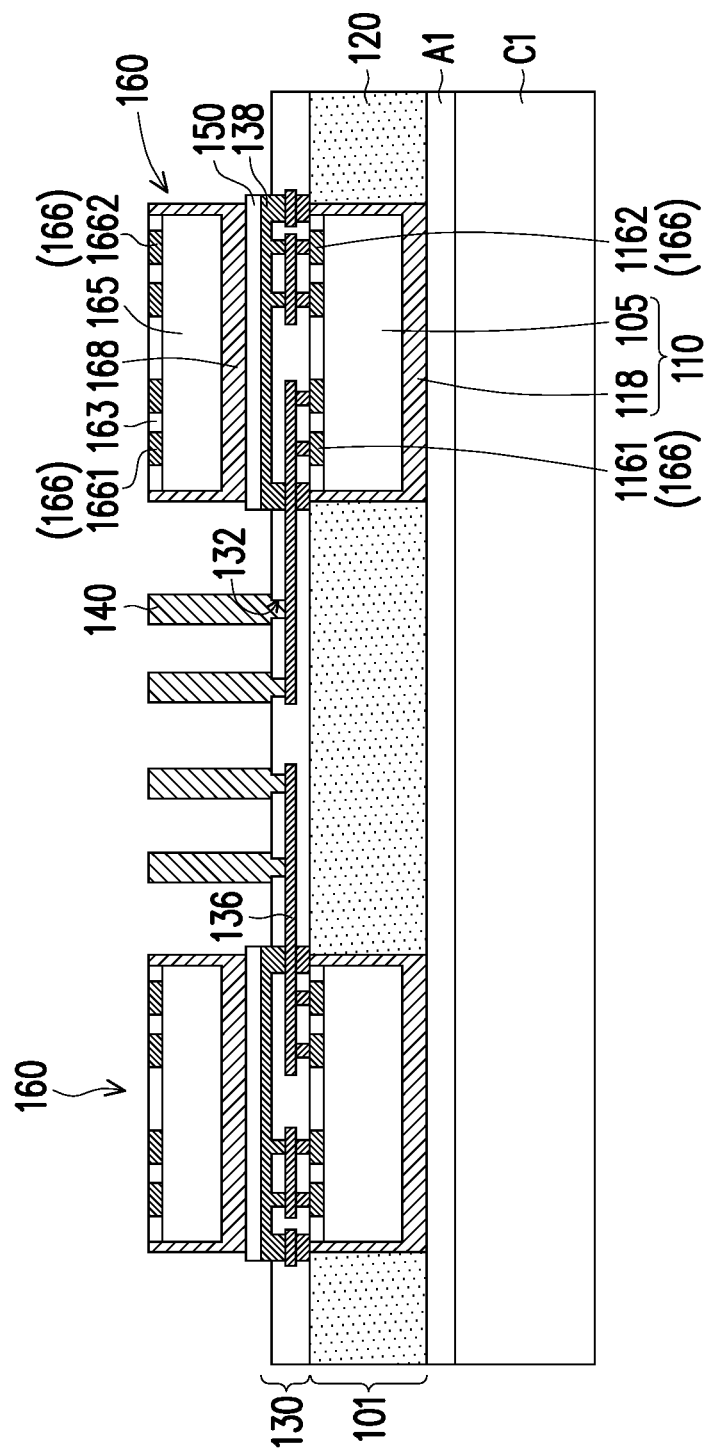
Figure 17:
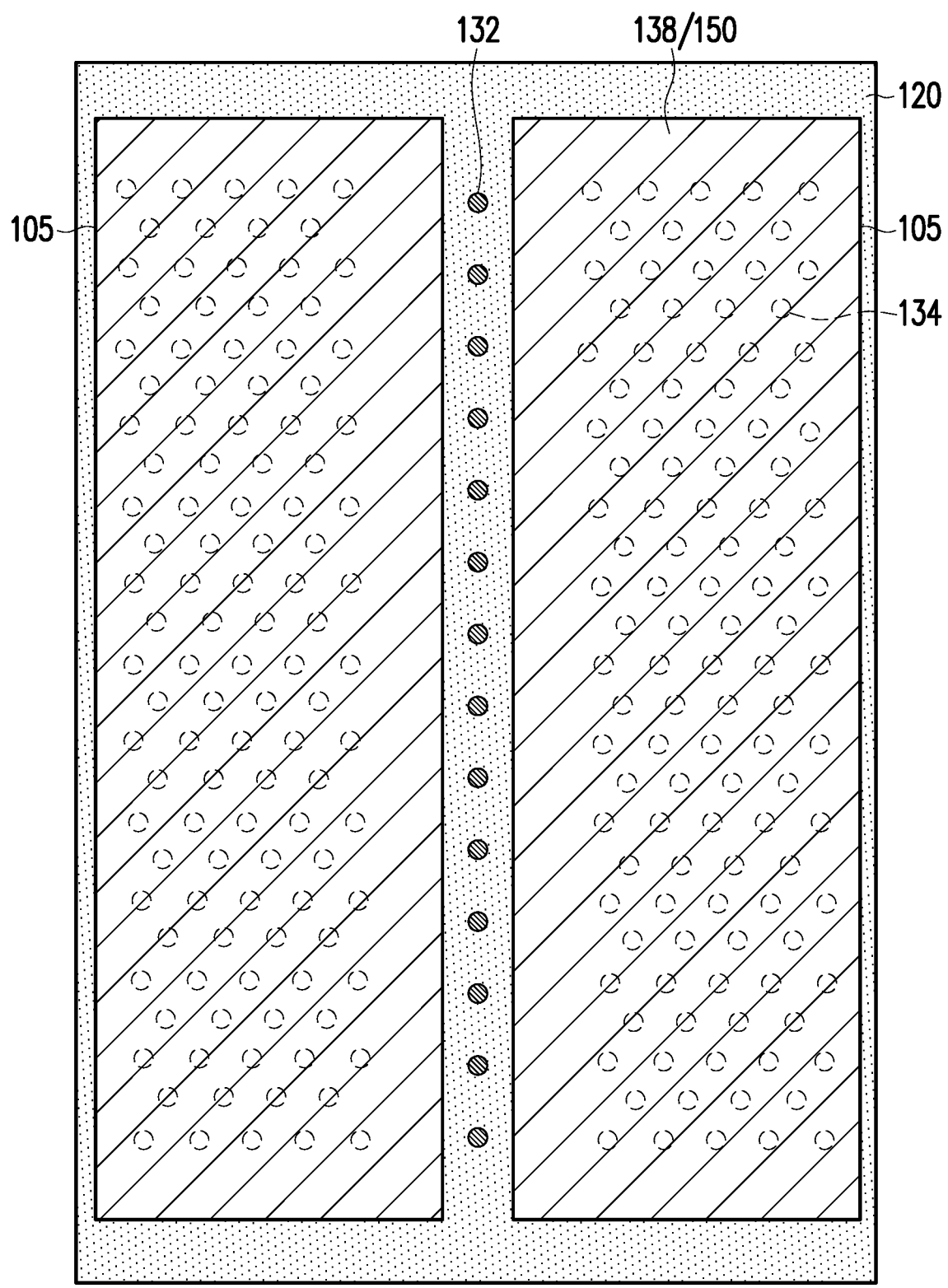
FIG. 17 illustrates a partial top view of an intermediate stage in a manufacturing of a semiconductor package according to some exemplary embodiments of the present disclosure.
Figure 18:
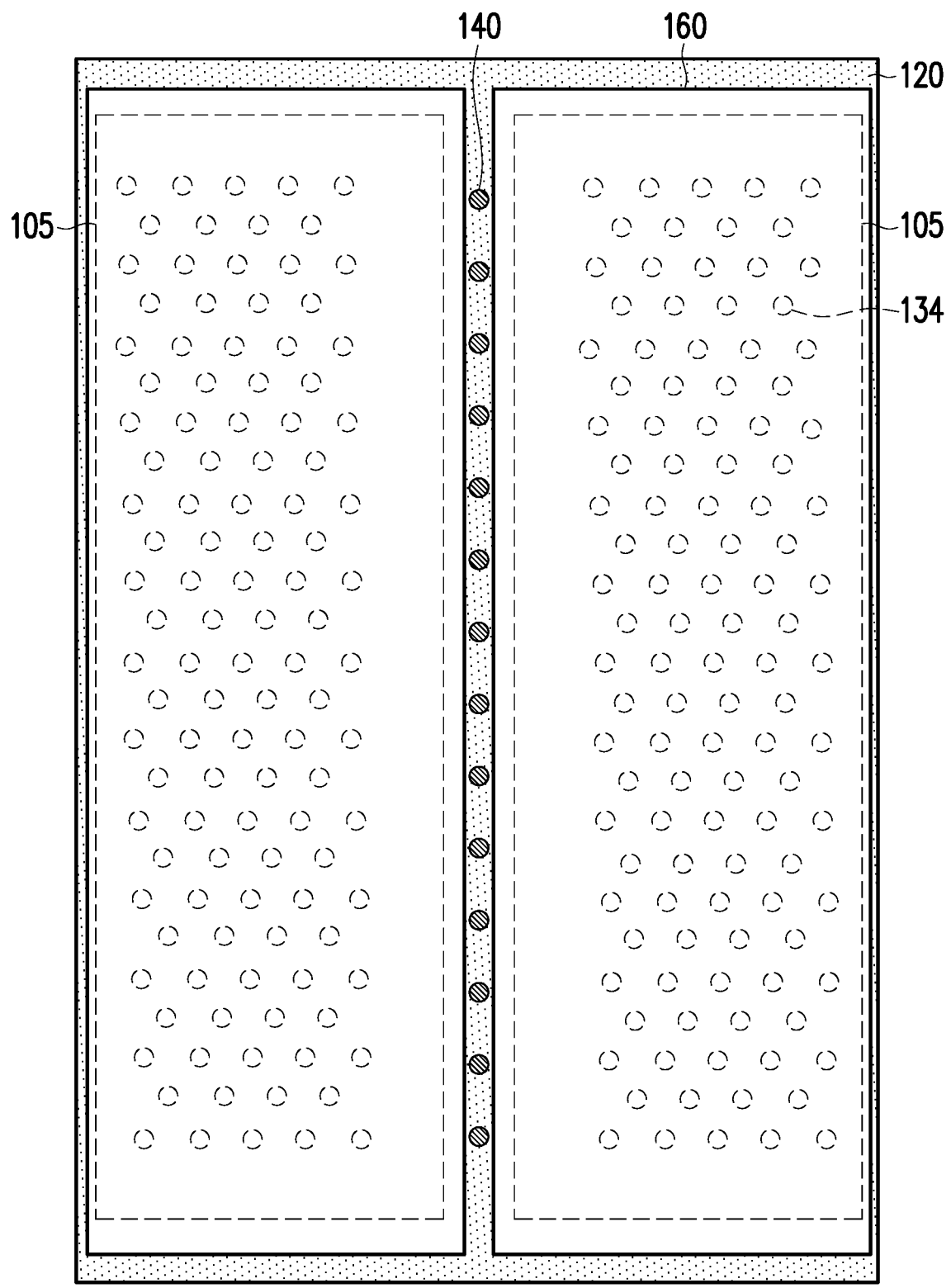
FIG. 18 illustrates a partial top view of an intermediate stage in a manufacturing of a semiconductor package according to some exemplary embodiments of the present disclosure.

It is noted that FIG. 16 to FIG. 18 show partial top views of a semiconductor package at different intermediate manufacturing stages shown in FIG. 6, FIG. 8 and FIG. 9. However, the numbers of the functional vias 132 and the thermal vias 134 illustrated in FIG. 16 to FIG. 18 are different from those of the functional vias 132 and the thermal vias 134 illustrated in FIG. 6, FIG. 8 and FIG. 9. For example, there are four rows of the functional vias 132 in the embodiments shown in FIG. 6, FIG. 8 and FIG. 9, while there are one row of the functional vias 132 in the embodiments shown in FIG. 6, FIG. 8 and FIG. 9. The disclosure does not limit numbers and layouts of the functional vias 132 and the thermal vias 134.

Referring to FIG. 7, in some embodiments, the first redistribution structure 130 may further includes a thermal metal layer 138, which is arranged furthermost from the first encapsulated integrated circuit 101, thermally coupled to the first metallization layer 118. In some embodiments, the thermal metal layer 138 may be formed by the same method and material as the rest of the redistribution circuits. The thermal metal layer 138 is electrically insulated from the functional vias 132 and fills the thermal vias 134, such that the thermal metal layer 138 is thermally coupled to the thermal vias 134. In some embodiments, the thermal metal layer 138 may be a wide metal, which means a solid metal pad as it is shown in FIG. 17, and the thermal metal layer 138 may cover, for example, a region of the first redistribution structure 130 that covers the active surface of the first integrated circuit 105. In some exemplary embodiments, the first metallization layer 118 covers the back surface and the side surface of the first integrated circuit 105 and is thermally coupled to the thermal metal layer 138. Accordingly, the first thermal vias 134 are thermally coupled to the first metallization layer 118 through the thermal metal layer 138.

In some embodiments, the first metallization layer 118 may be electrically connected to a ground of the first redistribution structure 130. In this way, the first metallization layer 118, apart from being used for heat dissipation, may also be used for reducing or inhibiting the electromagnetic field in a space by blocking the field with barriers made of conductive or magnetic materials. In other words, the first metallization layer 118 may function as an electromagnetic interference shielding layer, which may reduce the coupling of, for example, radio waves, electromagnetic fields and electrostatic fields. In addition, the heat generated by the first integrated circuit 105 may also be dissipated through the first redistribution structure 130 along with the side surface up to the first metallization layer 118.

FIG. 17 illustrates a partial top view of an intermediate stage in a manufacturing of a semiconductor package according to some exemplary embodiments of the present disclosure. Referring to FIG. 8 and FIG. 17, in some embodiments, a solder layer 150 is provided over the first redistribution structure 130. In some exemplary embodiments, the solder layer 150 is formed over and is thermally coupled to the thermal metal layer 138 of the first redistribution structure 130. The solder layer 150 may be formed by applying a substantially uniform volume of solder paste over the thermal metal layer 138 as it is shown in FIG. 17. For example, a solder mask may be applied on the first redistribution structure 130 before the solder paste is printed to protect the areas that do not need to receive the solder paste. In some embodiments, the solder layer 150 may include a tacky mixture of flux and solder particles, or the like. In some embodiments, the solder layer 150 may be applied onto the first redistribution structure 130 with a stencil, which is a thin flat material, such as stainless steel that has apertures through which solder paste is applied or printed. In an alternative embodiment, the solder layer 150 may be directly fabricated on the thermal layer 138 through plating process.

Referring to FIG. 8, in some embodiments, a plurality of through vias (conductive pillars) 140 are provided on the first redistribution structure 130. In some embodiments, the through vias 140 are formed over the functional vias 132 of the first redistribution structure 130 by photolithography, plating, and photoresist stripping process, etc. In other words, the through vias 140 fill the functional vias 132 and protruded from the first redistribution structure 130. Accordingly, the through vias 140 are electrically connected to the first functional vias 132. In some alternative embodiments, the through vias 140 may be pre-fabricated through other processes and are mounted (soldering) over the first redistribution structure 130. For example, the through vias 140 may be copper posts or other metallic posts.

FIG. 18 illustrates a partial top view of an intermediate stage in a manufacturing of a semiconductor package according to some exemplary embodiments of the present disclosure. Referring to FIG. 9 and FIG. 18, after the solder layer 150 is provided over the thermal metal layer 138, at least one second integrated circuit structure 160 (two second integrated circuit structures 160 are illustrated, but not limited thereto) is placed on the thermal metal layer 138 of the first redistribution structure 130 by a pick and place tool. The pick and place tool picks up the second integrated circuit structures 160 from, for example, a tape carrier, and places them on the first redistribution structure 130.

In some embodiments, the structure of the second integrated circuit structure 160 may be similar to that of the first integrated circuit structure 110 as described above. For example, the second integrated circuit structure 160 may include a second integrated circuit 165 having a second back surface and a second metallization layer 168 at least covering the second back surface and in contact with the solder layer 150. In some embodiments, the second integrated circuit structure 160 may include a plurality of conductive pads 166, which include a plurality of functional pads 1661 and a plurality of thermal (dummy) pads 1662. For example, the functional pads 1661 in a semiconductor package are electrically connected to a front-side and/or back-side redistribution structure or an electrical component of the same semiconductor package or another semiconductor package. However, the thermal (dummy) pads 1662 may be at a floating potential and electrically insulated from a front-side or back-side redistribution layer structure or an electrical component of the same semiconductor package or another semiconductor package. In some embodiments, the thermal (dummy) pads 1662 are electrically insulated from the functional vias 1661 and may be used, for example, to adjust a local pattern density for better polishing effect.

In some embodiments, the manufacturing method of the second integrated circuit structure 160 may also be similar to that of the first integrated circuit structure 110 as described regarding FIG. 1 and FIG. 2. For example, the second integrated circuit 165 is provided on a tape carrier (the tape carrier TP shown in FIG. 1, for example) with its back surface faces away from the tape carrier TP. Then, a metallization process is performed to form the second metallization layer 168 on the second integrated circuit 165 to form the second integrated circuit structure 160.

Then, the second integrated circuit structure 160 may be picked up from the tape carrier and placed (provided) onto the solder layer 150 by a pick and place tool. In some embodiments, a reflowing process is performed to bond the second integrated circuit structure 160 to the thermal metal layer 138 of the first redistribution structure 130. For example, the resultant structure shown in FIG. 9 may be conveyed into a reflow soldering oven, and the second integrated circuit structure 165 is aligned to respective solder layer 150.

Figure 10:
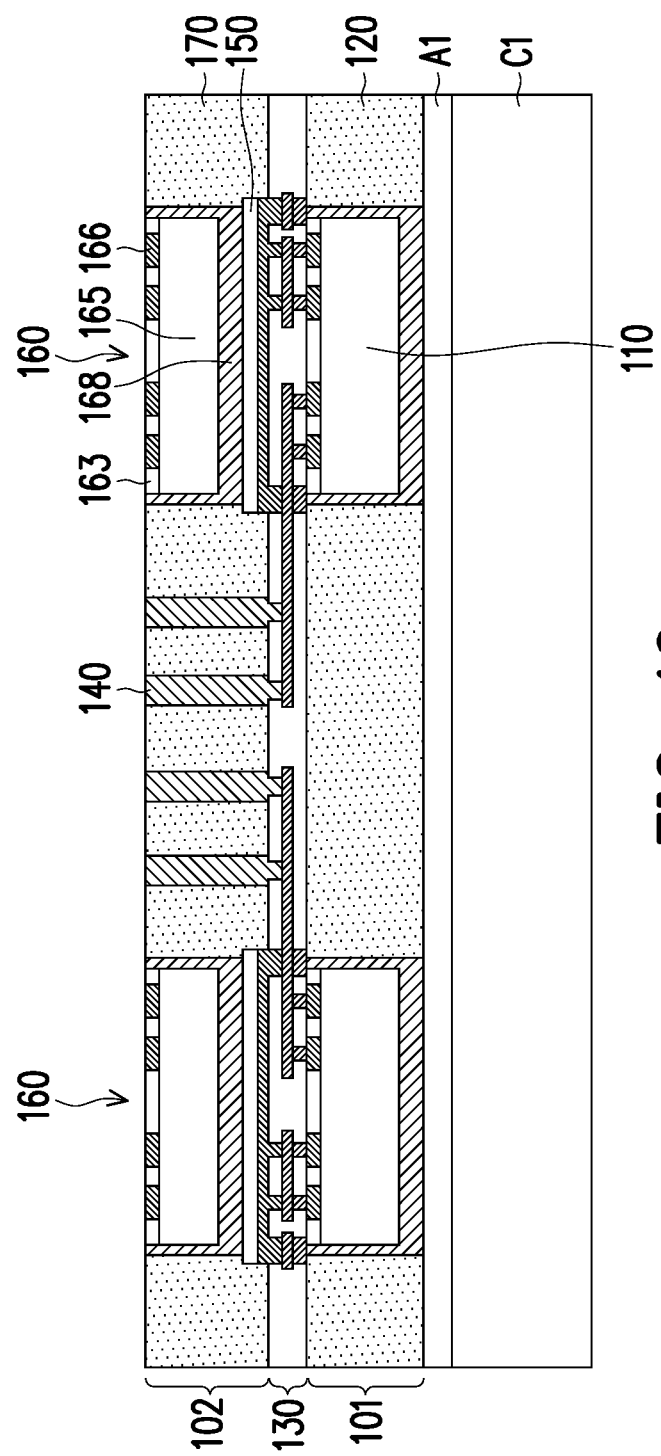

Referring to FIG. 10, in some embodiments, a second encapsulation material 170 is formed over the first redistribution structure 130 to laterally encapsulate the second integrated circuit structure 160 and the through vias 140. In other words, the second encapsulation material 170 fills the gaps between the second integrated circuit structure 160 and the through vias 140, and covers the first redistribution structure 130. Accordingly, the through vias 140 extend through the second encapsulation material 170. In some embodiments, the second encapsulation material 170 is a single-layered encapsulating material, which may include a molding compound formed by a molding process. The material of the second encapsulation material 170 may include epoxy or other suitable resins. For example, the second encapsulation material 170 may be epoxy resin containing chemical filler.

In some embodiments, the second encapsulation material 170 may firstly cover the top surfaces of the through vias 140 and the top surfaces of the second integrated circuit structure 160. Then, the second encapsulation material 170 is planarized to reveal the through vias 140 and the second integrated circuit structure 160. In some embodiment, the top surface of the second encapsulation material 170 are ground and polished until the through vias 140 and the conductive pads 166 of the second integrated circuit structure 160 are revealed. Accordingly, a ground surface of the second encapsulation material 170 is substantially coplanar with the top surfaces of the through vias 140 and the conductive pads 166 of the second integrated circuit structure 160. In some embodiments, the insulation layer 163 is also ground for revealing the conductive pads 166 underneath. The grinding process of the second encapsulation material 170 may include mechanical grinding or chemical mechanical polishing (CMP), for example. After the grinding process, a cleaning step may be optionally performed, for example, to clean and remove the residue generated from the grinding step. However, the disclosure is not limited thereto, and the planarizing step may be performed through any other suitable method. Throughout the description, the resultant structure shown in FIG. 10 is referred to as a second encapsulated integrated circuit 102, which may have a wafer form in the process. Accordingly, the second encapsulated integrated circuit 102 may include the second integrated circuit 165, the second metallization layer 168 covering the back surface of the second integrated circuit 165, and the second encapsulation material 170 laterally encapsulating the second integrated circuit structure 160 and the through vias 140.

Figure 11:
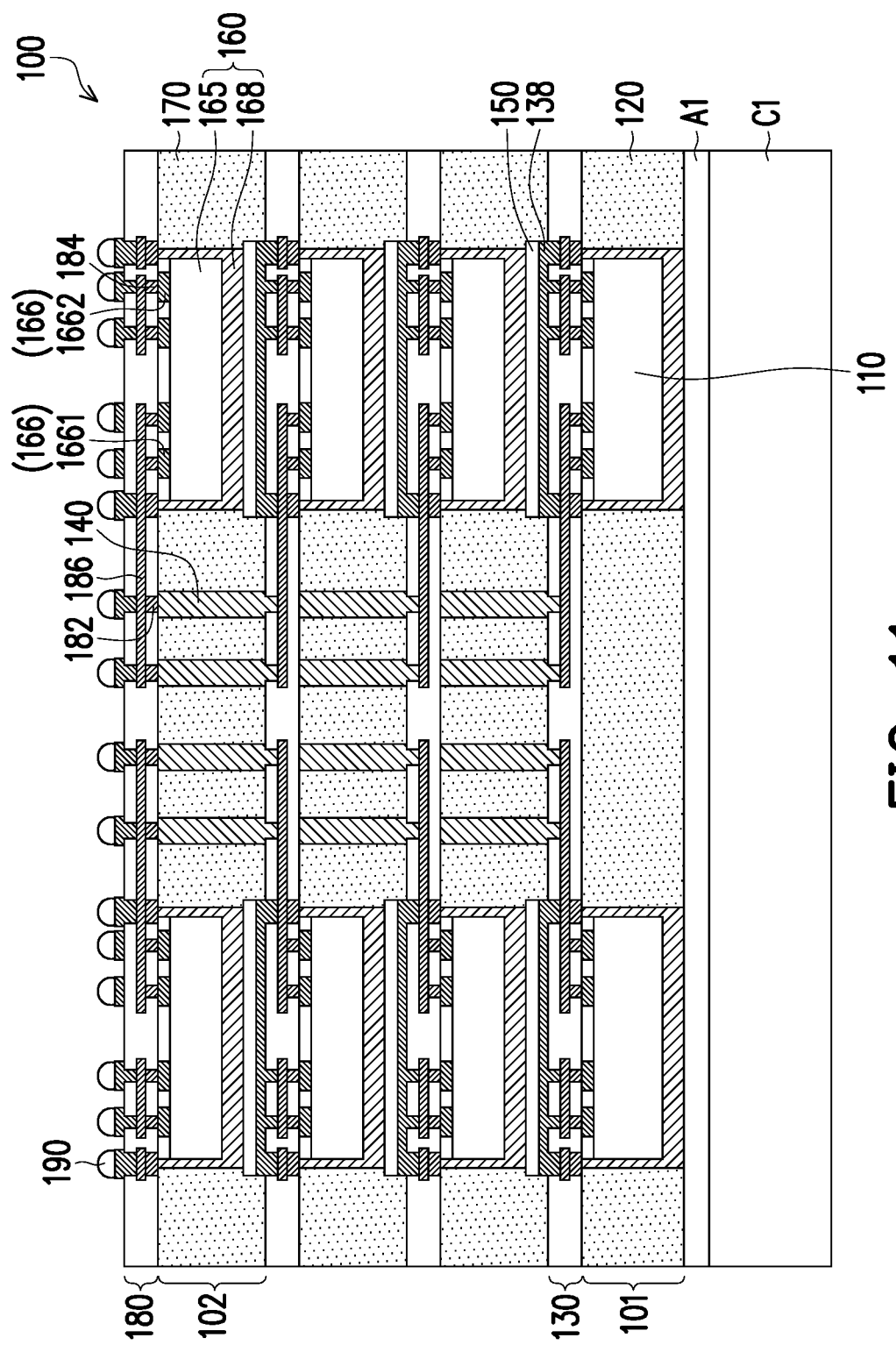

Referring to FIG. 11, in some embodiments, a second redistribution structure 180 is provided over the second encapsulated integrated circuit. In some embodiments, the second redistribution structure 180 is formed on the second encapsulation material 170 and second integrated circuit structure 160. The second redistribution structure 180 is electrically connected to the through vias 140 and the conductive pads 166 of the second integrated circuit 165. With such arrangement, the through vias 140 extending through the second encapsulation material 170 for electrically connecting the first redistribution structure 130 and the second redistribution structure 180. In some embodiments, a plurality of dielectric layers and a plurality of redistribution circuit layers may be stacked on top of one another alternately to form the redistribution structure 180 shown in FIG. 11. The material of the dielectric layer of the redistribution structure 180 may include organic polymer such as, but not limited to, polyimide, etc. The material of the redistribution circuit layer may include copper, or any other suitable materials.

In some embodiments, the second metallization layer 168 may cover both the back surface and the side surface of the second integrated circuit 165 and be either floating or electrically connected to a ground of the second redistribution structure 180. In the embodiment of the second metallization layer 168 being connected to the ground, the second metallization layer 168, apart from being used for heat dissipation, may also be used for reducing or inhibiting the electromagnetic field in a space by blocking the field with barriers made of conductive or magnetic materials. In other words, the second metallization layer 168 may function as an electromagnetic interference shielding layer, which may reduce the coupling of, for example, radio waves, electromagnetic fields and electrostatic fields.

In some embodiments, the second redistribution structure 180 may include a plurality of functional vias 182 electrically connected to the functional pads 1661 and a plurality of thermal (dummy) vias 184 thermally coupled to the thermal (dummy) pads 1662. The functional vias 182 may be disposed within the dielectric layers for connecting the redistribution circuits. In some embodiments, the functional vias 182 are electrically connected to the through vias 140 and the functional pads 1661 through redistribution circuit 186. The thermal vias 184 may also be disposed within the dielectric layers. In some embodiments, the thermal vias 184 are electrically insulated from any functional circuit, functional vias 182 and/or functional pads 1661. Instead, the thermal vias 184 may be thermally coupled to the second metallization layer 168 and other thermal (dummy) circuits of second redistribution structure 180. In some embodiments, the thermal (dummy) vias 184 may reinforce the mechanical strength of the dielectric layers. Accordingly, the through vias 140 are electrically insulated from the first metallization layer 138 and the second metallization layer 168.

In some embodiments, a singulation process may be performed to form a plurality of semiconductor packages 100. During the singulation (dicing) process, a wet sawing operation may be performed by a saw to cut the semiconductor packages 100 in a wafer form along the scribe lines. The singulation process may be performed through a cutting by a mechanical or laser saw may be used to separate multiple semiconductor packages 100 from one another. At the time, the manufacturing process of the semiconductor package 100 may be substantially done.

Throughout the description, one encapsulated integrated circuit (e.g. encapsulated integrated circuit 101, 102) with corresponding redistribution structure (e.g. redistribution structure 130, 180) provided thereon is referred to as a fan-out tier. In some exemplary embodiments, multiple fan-out tiers are provided (four fan-out tiers are illustrated herein, but not limited thereto) to form the semiconductor package 100 shown in FIG. 11. The semiconductor package 100 can be seen as a vertical stack of fan-out tiers. The description above merely illustrates the manufacturing process of two of the tiers in the semiconductor package 100, but it should be well understood that the semiconductor package 100 may be configured with fewer or more fan-out tiers (i.e., fewer or more integrated circuits) depending on the amount of memory desired for a system. Each of the integrated circuits may include a plurality of storage locations, with each storage location on each of the integrated circuits having a unique memory address. In some embodiments, semiconductor package 100 may be seen as a dynamic random access memory (DRAM) device, although other memory types including, but not limited to, static random access memory (SRAM) and read only memory may be used.

With such arrangement, thermal (dummy) elements such as the metallization layers 138, 168, the thermal pads 1162, 1662, the thermal vias 134, 184, thermal metal layer 138, etc., are thermally coupled to one another and jointly form a heat dissipation path, which advantageously provide improved thermal dissipation for the semiconductor package 100. In addition, the thermal (dummy) elements are advantageously formed in the same material layers that conductive (functional) elements, such as the functional pads 1161, 1661 and the functional vias 132, 182, of the semiconductor package 100 are formed in. For example, the thermal pads 1162, 1662 are formed in the same conductive layer that functional pads 1161, 1661 are formed on the integrated circuits 105, 165. Similarly, and the thermal vias 134, 184 are formed in the same conductive layer that functional vias 132, 182 are formed in the dielectric layer. Thus, no additional processing steps are required to include the thermal (dummy) elements in the semiconductor package 100. Existing lithography masks and packaging processes for the conductive elements may advantageously be modified to include the thermal (dummy) elements in the semiconductor package 100.

In addition, the metallization layer 118/168 may also help improving the warpage of the integrated circuit 105/165. In some embodiments, the metallization layer 118/168 may include a protection layer, which may be a conductive metal such as stainless steel (SUS) layer, and a conductive layer, which may be a material such as copper, silver, a palladium/copper alloy, or the like. It has been proved that the metallization layer 118/168 including a protection layer (SUS layer) with 0.3 µm to 0.6 µm in thickness and a conductive layer (copper layer) with 2 µm to 6 µm in thickness would help reducing the warpage of the integrated circuit 105/165 in 62%. However, the disclosure does not limit composition of the metallization layer 118/168. As long as the metallization layer 118/168 is covering the back surface of the integrated circuit 105/165, warpage of the integrated circuit 105/165 can be improved.

Figure 12:
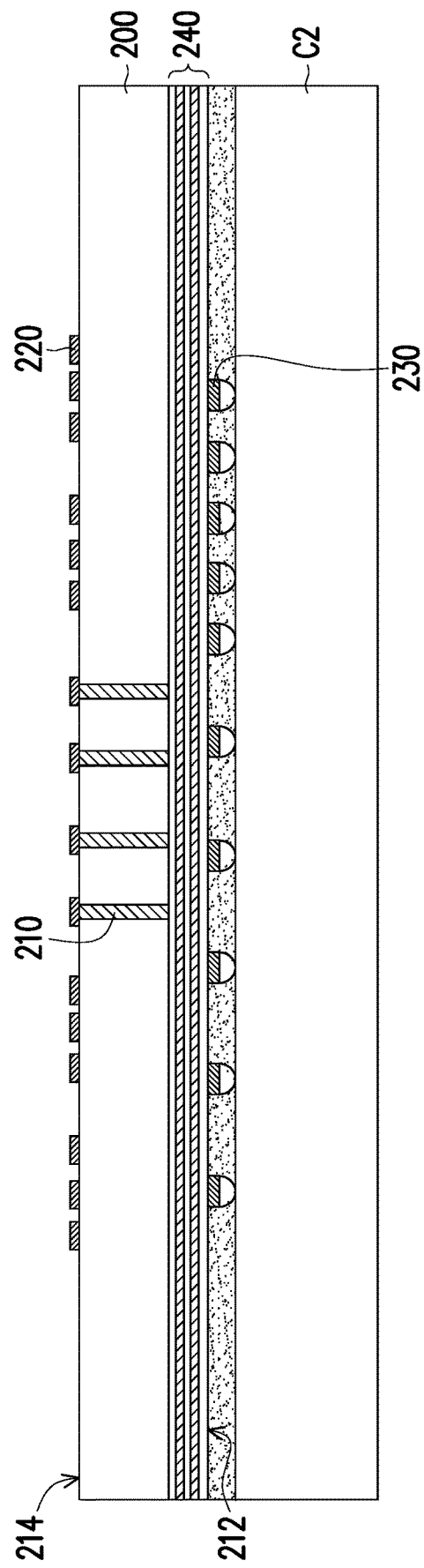
Figure 13:
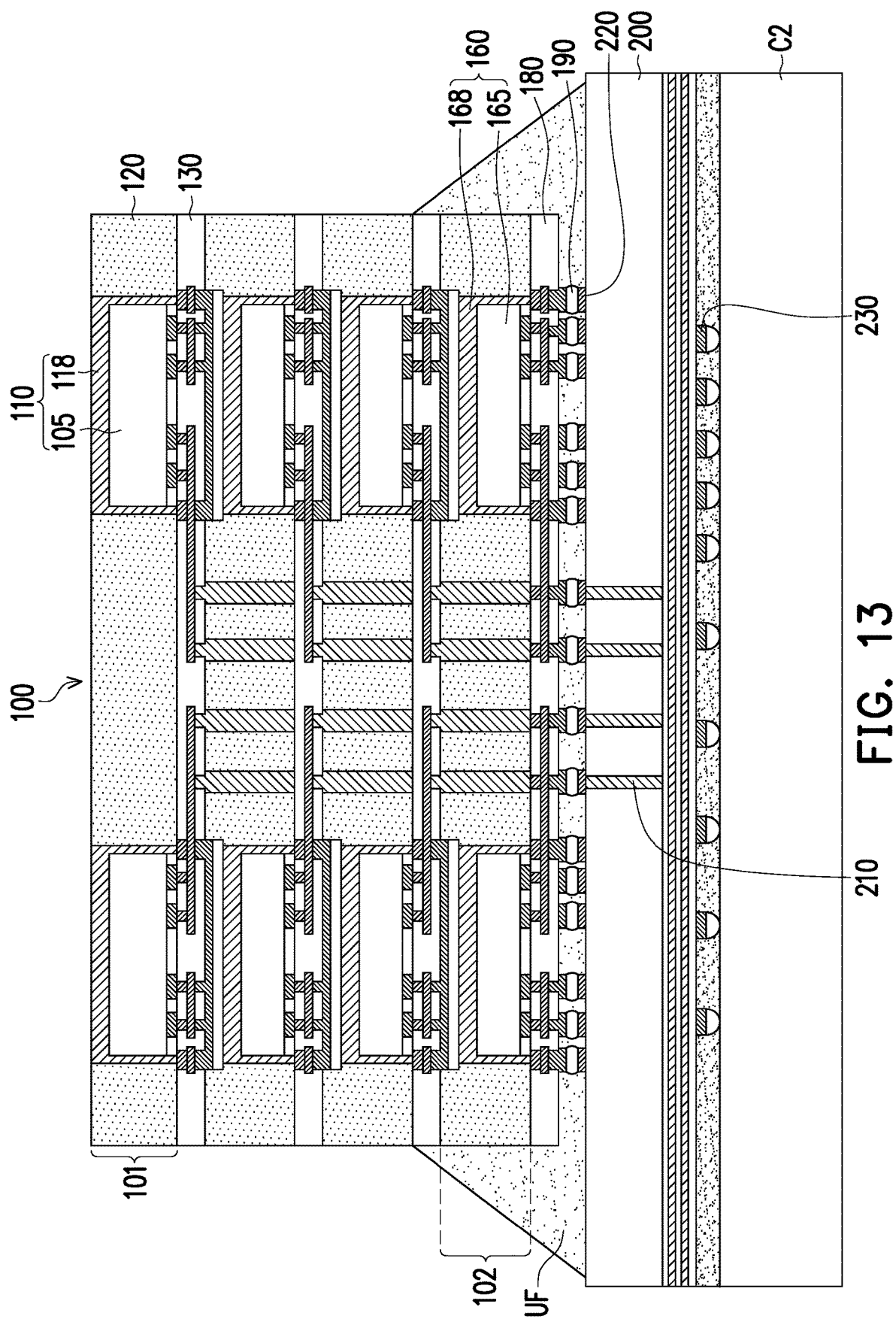

Referring to FIG. 12 and FIG. 13, in some exemplary embodiments, an integrated circuit device 200 is bonded onto the bottommost redistribution structure (e.g. the second redistribution structure 180) of the semiconductor package 100 through a plurality of conductive bumps 190. In detail, the integrated circuit device 200 may be firstly provided on a carrier C2. In some embodiments, the integrated circuit device 200 may be attached onto the carrier C2 by an adhesive (not shown). The adhesive may be a die attach film (DAF), or the like. In some embodiments, the carrier C2 may be a glass carrier, a ceramic carrier, or the like, and may provide temporary structural support during the formation of various components of a semiconductor package (e.g., the semiconductor package 10 shown in FIG. 14). In some embodiments, the carrier C2 may be coated with a de-bonding layer. The material of the debond layer may be any material suitable for de-bonding the carrier C1 from the above layers disposed thereon. For example, the de-bonding layer may be a ultra-violet (UV) curable adhesive, a heat curable adhesive, an optical clear adhesive or a light-to-heat conversion (LTHC) adhesive, or the like, although other types of de-bonding layer may be used. In addition, the de-bonding layer may be also adapted to allow light or signal to pass through. It is noted that the materials of the de-bonding layer and the carrier C2 are merely for illustration, and the disclosure is not limited thereto.

In accordance with some embodiments of the disclosure, the integrated circuit device 200 may be firstly formed in a wafer having multiple integrated circuits and then singulated along scribe lines. In some embodiments, the integrated circuit device 200 may be a logic die, which provides logic functions and may be a system on chip (SoC), an application processor (AP), or the like. The integrated circuit device 200 may include an active surface 212 having a plurality of contact pads 230 and facing the carrier C2, a back surface 214 opposite to the active surface 212, and a plurality of through vias (TSVs) 210 extending through the integrated circuit device 200. The integrated circuit device 200 may further include a redistribution structure 240 for electrically connecting the contact pads 230, and the through vias (TSVs) 210 extending through the integrated circuit device 200 for connecting the redistribution structure 240 and the contact pads 220 on the back surface 214.

Then, the resultant structure shown in FIG. 11 may be flipped over and mounted onto the integrated circuit device 200, and the carrier C1 may be removed. In some embodiments, the carrier C1 is detached from the back surface of the semiconductor package 100 by causing the adhesive A1 thereon to lose or reduce adhesion. The adhesive A1 is then removed along with the carrier C1. For example, the adhesive A1 may be exposed to UV light, so that the adhesive A1 loses or reduces adhesion, and hence the carrier C1 and the adhesive A1 can be removed.

In some exemplary embodiments, the integrated circuit device 200 is bonded with the semiconductor package 100 through the conductive bumps 190. In some embodiments, the conductive bumps 190 may be micro bumps, which may include copper posts and may be called copper post (or pillar) bumps, but the disclosure is not limited thereto. In some embodiments, each of the conductive bumps 190 may include an UBM layer, which may include a diffusion barrier layer and a thin seed layer, in accordance with some embodiments. The diffusion barrier layer may be a titanium layer, a titanium nitride layer, a tantalum layer, or a tantalum nitride layer. The materials of seed layer may include copper or copper alloys, and hence is referred to as copper seed layer hereinafter. However, other metals, such as silver, gold, aluminum, and combinations thereof, may also be included. In some embodiments, the micro bumps 190 may also include a copper layer, a metal layer, and a solder cap, which are formed by plating with a photo mask defining the openings, in accordance with some embodiments. In some embodiments, the metal layer is a nickel-containing layer comprising, for example, a nickel layer or a nickel alloy layer by plating. The metal layer prevents or at least retards the formation of an inter-metallic compound (IMC) between copper and solder. The solder cap may be a lead-free pre-solder layer formed of, for example, SnAg, or a solder material, including alloys of tin, lead, silver, copper, nickel, bismuth, or combinations thereof. In some embodiments, the conductive bumps 180 does not include solder cap. In some embodiments, the conductive bumps 180 does not include solder cap and metal layer. The disclosure does not limit the structure and the formation of the conductive bumps 190.

In some embodiments, the conductive bumps 190 may be formed on bottom surface of the second redistribution structure 180, the top surfaces of the integrated circuit device 200, or both. In some embodiments, the conductive bumps 190 are disposed between the semiconductor package 100 and the integrated circuit device 200 and electrically connecting the through vias 210 and the second redistribution structure 180. In some embodiments, the integrated circuit device 200 may further include a redistribution structure on the back surface 214 of the integrated circuit device 200, and the conductive bumps 190 are electrically connected to the redistribution structure of the integrated circuit device 200. In some embodiments, the semiconductor package 100 may be placed on the conductive bumps 190 by using, for example, a pick and place tool. Then, a reflow process may be applied to the conductive bumps 190.

In some embodiments, a filling material UF may be applied to fill the gap between the semiconductor package 100 and the integrated circuit device 200. In some embodiments, the filling material UF may be an underfill, a non-conductive film (NCF), or the like. The filling material UF is configured to absorb some of the residual stresses, to reduce the stress within the conductive bumps 190, and in the interfaces between the conductive bumps 190 and integrated circuit device 200.

Figure 14:
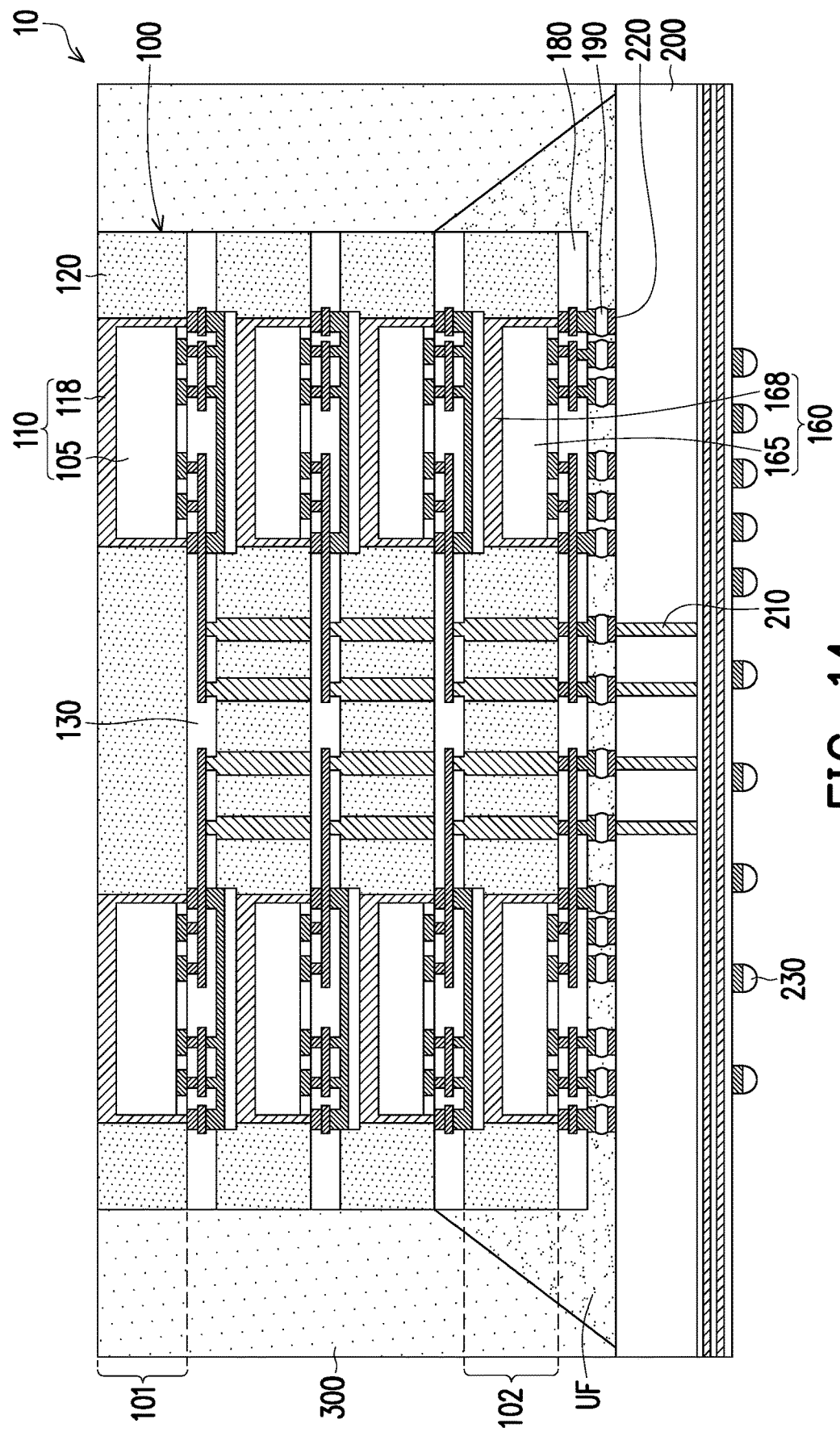

Referring to FIG. 14, in some embodiments, a third encapsulation material 300 is provided on integrated circuit device 200 for encapsulating the semiconductor package 100 including first encapsulated integrated circuit 101 and the second encapsulated integrated circuit 102. In some embodiments, the third encapsulation material 300 may include a molding compound, an epoxy, a resin, or the like. In one of the implementations, the molding compound includes various materials, for example, one or more of epoxy resins, phenolic hardeners, silicas, catalysts, pigments, mold release agents, etc. In some embodiments, a top surface of the third encapsulation material 300 may firstly cover the first metallization layer 118 of the first integrated circuit structure 110. Then, a thinning process, which may be a grinding process, is performed to thin the third encapsulation material 300 until the first metallization layer 118 are revealed, so the heat generated by the semiconductor package 10 can be dissipated through the first metallization layer 118. The resulting structure is shown in FIG. 14. Due to the thinning process, the top surfaces of the first metallization layer 118 are substantially level with the top surface of the third encapsulation material 300. At the time, the manufacturing process of the semiconductor package 10 may be substantially done.

Figure 15:
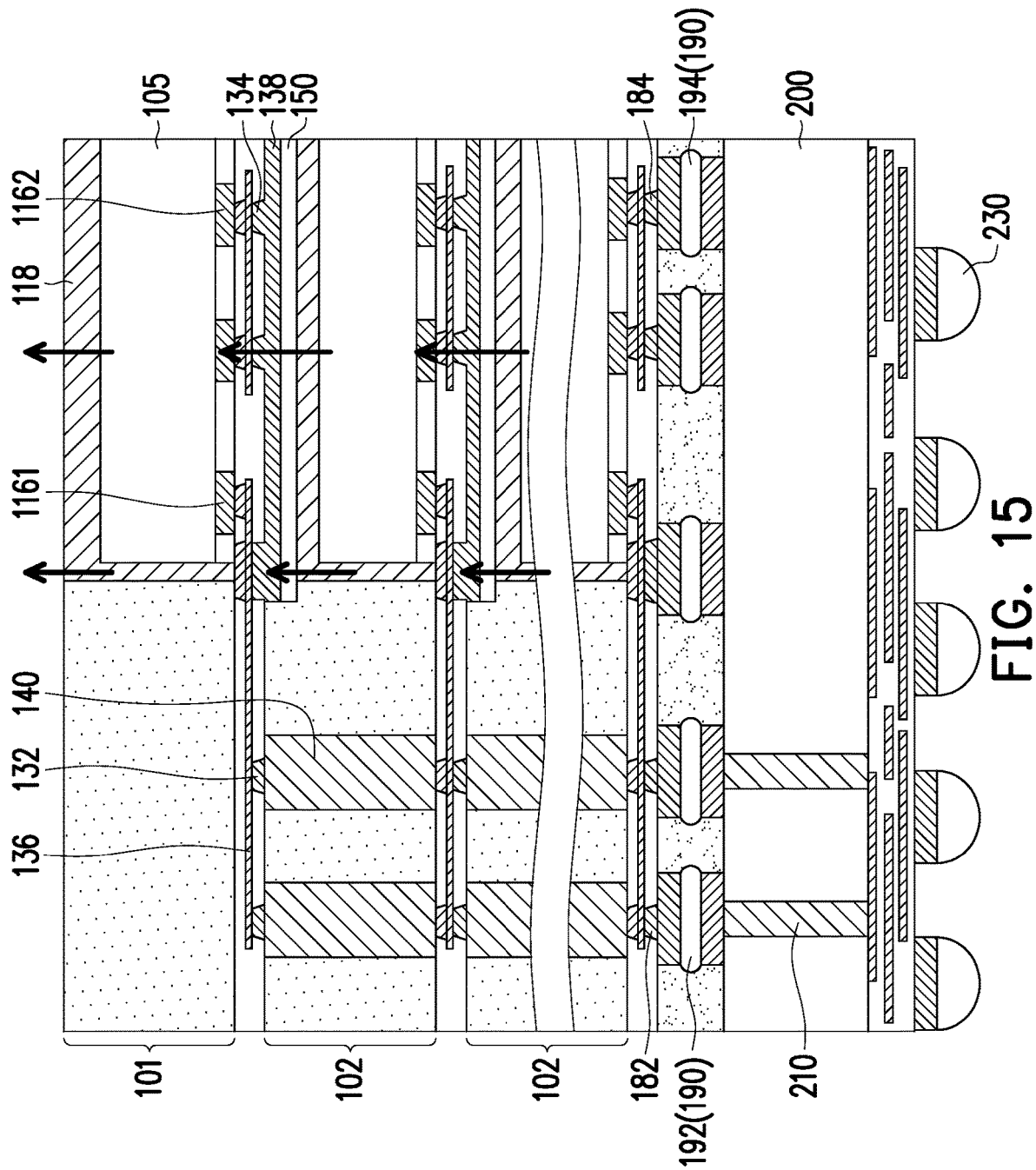
FIG. 15 illustrates a partial cross sectional view of a semiconductor package according to some exemplary embodiments of the present disclosure.

FIG. 15 illustrates a partial cross sectional view of a semiconductor package according to some exemplary embodiments of the present disclosure. Referring to FIG. 14 and FIG. 15, with such configuration, the integrated circuit device 200 may communicate with the integrated circuits (e.g. the integrated circuits 105, 165) in the fan-out tiers by the through vias 140 (disposed in each fan-out tier) and the redistribution structures 130, 180 (disposed over and/or under each fan-out tier) of the semiconductor package 100. In addition, in the semiconductor package 100, the thermal (dummy) elements such as the metallization layers 138, 168, the thermal pads 1162, 1662, the thermal vias 134, 184, thermal metal layer 138, etc., are thermally coupled to one another and jointly form a heat dissipation path, which advantageously provide improved thermal dissipation for the semiconductor package 10. In some embodiments, the heat generated by the semiconductor package 10 can be dissipated through more straight forward and paths (illustrated as the arrows in FIG. 15) with higher heat conductivity, so as to significantly improve the heat dissipation efficiency.

Moreover, the metallization layer 118/168 may also help improving the warpage of the integrated circuit 105/165. In some embodiments, the metallization layer 118/168 may include a protection layer, which may be a conductive metal such as stainless steel (SUS) layer, and a conductive layer, which may be a material such as copper, silver, a palladium/copper alloy, or the like. It has been proved that the metallization layer 118/168 including a protection layer (SUS layer) with 0.3 μm to 0.6 μm in thickness and a conductive layer (copper layer) with 2 μm to 6 μm in thickness would help reducing the warpage of the integrated circuit 105/165 in 62%. However, the disclosure does not limit composition of the metallization layer 118/168. As long as the metallization layer 118/168 is covering the back surface of the integrated circuit 105/165, warpage of the integrated circuit 105/165 can be improved.

In addition, the thermal (dummy) elements are advantageously formed in the same material layers that conductive (functional) elements, such as the functional pads 1161, 1661 and the functional vias 132, 182, of the semiconductor package 100 are formed in. For example, the thermal pads 1162, 1662 are formed in the same conductive layer that functional pads 1161, 1661 are formed on the integrated circuits 105, 165. Similarly, and the thermal vias 134, 184 are formed in the same conductive layer that functional vias 132, 182 are formed in the dielectric layer. Thus, no additional processing steps are required to include the thermal (dummy) elements in the semiconductor package 100. Existing lithography masks and packaging processes for the conductive elements may advantageously be modified to include the thermal (dummy) elements in the semiconductor package 100.

Based on the above discussions, it can be seen that the present disclosure offers various advantages. It is understood, however, that not all advantages are necessarily discussed herein, and other embodiments may offer different advantages, and that no particular advantage is required for all embodiments.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In accordance with some embodiments of the disclosure, a semiconductor package includes a first integrated circuit structure, a first encapsulation material, a first redistribution structure, a solder layer, a second integrated circuit structure, a second encapsulation material, and a second redistribution structure. The first integrated circuit structure includes a first integrated circuit having a first back surface and a first metallization layer covering the first back surface. The first encapsulation material laterally encapsulate the first integrated circuit structure. The first redistribution structure is disposed over the first integrated circuit structure and first encapsulation material, wherein the first back surface faces away from the first redistribution structure. The first redistribution structure includes a thermal metal layer furthermost from the first integrated circuit structure and thermally coupled to the first metallization layer. The solder layer is dispose over and thermally coupled to the thermal metal layer. The second integrated circuit structure is disposed on the first redistribution structure and includes a second integrated circuit having a second back surface and a second metallization layer covering the second back surface and in contact with the solder layer. The second encapsulation material laterally encapsulates the second integrated circuit structure. The second redistribution structure is disposed over the second integrated circuit structure and the second encapsulation material.

In accordance with some embodiments of the disclosure, a semiconductor package includes a first encapsulated integrated circuit, a first redistribution structure, a solder layer, a second encapsulated integrated circuit, a plurality of through vias, a second redistribution structure, an integrated circuit device and a plurality of conductive bumps. The first encapsulated integrated circuit includes a first integrated circuit having a first back surface, a first metallization layer covering the first back surface, and a first encapsulation material laterally encapsulating the first integrated circuit. The first redistribution structure is disposed over and electrically connected to the first encapsulated integrated circuit. The solder layer is dispose over and thermally coupled to the first redistribution structure. The second encapsulated integrated circuit is disposed on the first redistribution structure and includes a second integrated circuit, a second metallization layer covering the second back surface and in contact with the solder layer, and a second encapsulation material laterally encapsulating the second integrated circuit. The plurality of through vias extend through the second encapsulation material and electrically insulated from the first metallization layer and the second metallization layer. The second redistribution structure is disposed over and electrically connected to the second encapsulated integrated circuit. The integrated circuit device is disposed on the second redistribution structure. The plurality of conductive bumps are disposed between the integrated circuit device and the second redistribution structure.

In accordance with some embodiments of the disclosure, a manufacturing method of a semiconductor package includes the following steps. A first integrated circuit structure is provided on a carrier, wherein the first integrated circuit structure includes a first integrated circuit having a first back surface facing the carrier and a first metallization layer covering the first back surface. A first encapsulation material is provided on the carrier for laterally encapsulating the first integrated circuit structure and forming a first encapsulated integrated circuit. A first redistribution structure is provided over the first encapsulated integrated circuit, wherein the first redistribution structure comprises a thermal metal layer furthermost from the first encapsulated integrated circuit and thermally coupled to the first metallization layer. A solder layer is provided over the thermal metal layer. A plurality of through via are provided on the first redistribution structure. A second integrated circuit structure is provided on the solder layer, wherein the second integrated circuit structure includes a second integrated circuit having a second back surface and a second metallization layer covering the second back surface and in contact with the solder layer. A second encapsulation material is provided for laterally encapsulating the second integrated circuit structure and forming a second encapsulated integrated circuit. A second redistribution structure is provided over the second encapsulated integrated circuit. An integrated circuit device is bonded to the second redistribution structure through a plurality of conductive bumps.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacturing method of a semiconductor package, comprising:
    providing a first integrated circuit structure on a carrier, wherein the first integrated circuit structure comprises a first integrated circuit having a first back surface facing the carrier and a first metallization layer covering the first back surface;
    providing a first encapsulation material on the carrier for laterally encapsulating the first integrated circuit structure and forming a first encapsulated integrated circuit;
    providing a first redistribution structure over the first encapsulated integrated circuit, wherein the first redistribution structure comprises a thermal metal layer furthermost from the first encapsulated integrated circuit, wherein the thermal metal layer is thermally coupled to the first metallization layer;
    providing a solder layer over the thermal metal layer;
    providing a plurality of through via on the first redistribution structure;
    providing a second integrated circuit structure on the solder layer, wherein the second integrated circuit structure comprises a second integrated circuit having a second back surface and a second metallization layer covering the second back surface, wherein the second metallization layer is in contact with the solder layer;
    providing a second encapsulation material for laterally encapsulating the second integrated circuit structure and forming a second encapsulated integrated circuit;
    providing a second redistribution structure over the second encapsulated integrated circuit; and
    bonding an integrated circuit device to the second redistribution structure through a plurality of conductive bumps.

2. The manufacturing method of the semiconductor package as claimed in claim 1, wherein providing the first integrated circuit structure on the carrier further comprises:
    providing the first integrated circuit on a tape carrier, wherein the first back surface faces away from the tape carrier;
    forming the first metallization layer on the first integrated circuit to form the first integrated circuit structure; and
    picking up the first integrated circuit structure and attaching the first integrated circuit structure on the carrier by an adhesive.

3. The manufacturing method of the semiconductor package as claimed in claim 1, wherein providing the second integrated circuit structure on the solder layer further comprises:
    providing the second integrated circuit on a tape carrier, wherein the second back surface faces away from the tape carrier;
    forming the second metallization layer on the second integrated circuit to form the second integrated circuit structure;
    picking up the second integrated circuit structure from the tape carrier and placing the second integrated circuit structure on the solder layer; and
    performing a reflow process to bond the second integrated circuit structure and the first redistribution structure.

4. The manufacturing method of the semiconductor package as claimed in claim 1, further comprising:
    providing a third encapsulation material on integrated circuit device for encapsulating the first encapsulated integrated circuit and the second encapsulated integrated circuit.

5. The manufacturing method of the semiconductor package as claimed in claim 1, wherein the integrated circuit device comprises a logic die, a system on chip (SoC), or an application processor (AP).

6. The manufacturing method of the semiconductor package as claimed in claim 1, wherein the integrated circuit device further comprises a plurality of through vias extending through the integrated circuit device.

7. The manufacturing method of the semiconductor package as claimed in claim 1, wherein the first integrated circuit structure further comprises a first active surface opposite to the first back surface, and a plurality of conductive pads disposed on the first active surface.

8. The manufacturing method of the semiconductor package as claimed in claim 7, wherein the first integrated circuit structure is provided on the carrier with the active surface face away from the carrier.

9. A manufacturing method of a semiconductor package, comprising:
    providing a first integrated circuit structure, wherein the first integrated circuit structure comprises a first integrated circuit and a first metallization layer in direct contact with a first back surface and a first side surface of the first integrated circuit, wherein the first side surface connects the first back surface and a first active surface opposite to the first back surface;
    providing a first encapsulation material to laterally encapsulate the first integrated circuit structure;
    providing a first redistribution structure over the first integrated circuit structure and the first encapsulation material, wherein the first redistribution structure comprises a thermal metal layer thermally coupled to the first metallization layer;
    providing a plurality of through via on the first redistribution structure; and
    providing a second integrated circuit structure over the first redistribution structure, wherein the second integrated circuit structure comprises a second integrated circuit and a second metallization layer covering a second back surface of the second integrated circuit and thermally coupled to the thermal metal layer.

10. The manufacturing method of the semiconductor package as claimed in claim 9, wherein providing the first integrated circuit structure on the carrier further comprises:
    providing the first integrated circuit on a tape carrier, wherein the first back surface faces away from the tape carrier;
    forming the first metallization layer on the first integrated circuit to form the first integrated circuit structure; and
    picking up the first integrated circuit structure and attaching the first integrated circuit structure on the carrier by an adhesive.

11. The manufacturing method of the semiconductor package as claimed in claim 9, wherein the thermal metal layer is formed on a layer furthermost from the first integrated circuit structure and is electrically insulated from a plurality of functional vias of the first redistribution structure.

12. The manufacturing method of the semiconductor package as claimed in claim 9, wherein the thermal metal layer is formed as a solid metal pad covering a region of the first redistribution structure that covers the first integrated circuit.

13. The manufacturing method of the semiconductor package as claimed in claim 9, further comprising:
providing a solder layer over the thermal metal layer before the second integrated circuit structure is provided over the first redistribution structure.

14. The manufacturing method of the semiconductor package as claimed in claim 13, wherein the second integrated circuit structure is provided on the solder layer, and the second metallization layer is in contact with the solder layer.

15. The manufacturing method of the semiconductor package as claimed in claim 9, further comprising:
providing a second encapsulation material for laterally encapsulating the second integrated circuit structure;
providing a second redistribution structure over the second encapsulated integrated circuit.

16. The manufacturing method of the semiconductor package as claimed in claim 15, further comprising:
bonding an integrated circuit device to the second redistribution structure through a plurality of conductive bumps.

17. A manufacturing method of a semiconductor package, comprising:
providing an integrated circuit structure, wherein the integrated circuit structure comprises an integrated circuit and a metallization layer covering a back surface of the integrated circuit;
providing an encapsulation material to laterally encapsulate the integrated circuit structure;
providing a redistribution structure over the integrated circuit structure and the encapsulation material, wherein the redistribution structure comprises a thermal metal layer furthermost from the integrated circuit structure, wherein the thermal metal layer is thermally coupled to the metallization layer; and
providing a solder layer over the thermal metal layer, wherein the solder layer is a continuously extending layer and in direct contact with the thermal metal layer.

18. The manufacturing method of the semiconductor package as claimed in claim 17, wherein the solder layer is formed by applying a solder paste over a top surface of the thermal metal layer.

19. The manufacturing method of the semiconductor package as claimed in claim 17, wherein the first integrated circuit further comprises a first active surface opposite to the first back surface, a first side surface connecting the first active surface and the first back surface, a plurality of conductive pads disposed on the first active surface and an insulation layer covering the plurality of conductive pads.

20. The manufacturing method of the semiconductor package as claimed in claim 19, wherein the first metallization layer further covers the first side surface of the first integrated circuit and a side surface of the insulation layer.

* * * * *